United States Patent [19]
Ashcraft et al.

[11] Patent Number: 5,885,911
[45] Date of Patent: Mar. 23, 1999

[54] ELECTROMAGNETIC ATTENUATING LAMINATE AND METHOD FOR ITS FORMATION

[75] Inventors: H. Carl Ashcraft; Walter B. May; Douglas R. Dowell, all of Orlando, Fla.

[73] Assignee: Martin Marietta Corporation, Bethesda, Md.

[21] Appl. No.: 708,901

[22] Filed: Sep. 5, 1996

Related U.S. Application Data

[63] Continuation of Ser. No. 375,578, Jan. 19, 1995, abandoned.

[51] Int. Cl.⁶ .............................. B32B 5/28; B32B 27/12; H05K 9/00
[52] U.S. Cl. ................ 442/117; 174/35 MS; 428/297.4; 428/298.7; 428/299.1; 428/299.4; 442/59
[58] Field of Search .............................. 428/297.4, 298.7, 428/299.1, 299.4; 442/59, 60, 117; 336/84 C; 174/35 MS

[56] References Cited

U.S. PATENT DOCUMENTS

| | | | |
|---|---|---|---|
| 2,923,934 | 2/1960 | Halpern | 342/1 |
| 2,929,436 | 3/1960 | Hampshire | 264/121 |
| 3,599,210 | 8/1971 | Stander | 342/2 |
| 3,843,593 | 10/1974 | Shell et al. | 342/2 |
| 3,867,250 | 2/1975 | Jankowiak et al. | 42/9 |
| 4,325,849 | 4/1982 | Rosen et al. | 252/62 |
| 4,360,440 | 11/1982 | Boyer et al. | 252/62 |
| 4,429,216 | 1/1984 | Brigham | 219/528 |
| 4,474,685 | 10/1984 | Annis | 252/503 |
| 4,534,998 | 8/1985 | DuPont et al. | 427/122 |
| 4,569,786 | 2/1986 | Deguchi | 252/503 |
| 4,610,808 | 9/1986 | Kleiner | 252/512 |
| 4,678,699 | 7/1987 | Kritchevsky et al. | 428/175 |
| 4,738,896 | 4/1988 | Stevens | 428/315.9 |
| 4,759,950 | 7/1988 | Stevens | 427/585 |
| 4,789,563 | 12/1988 | Stevens | 427/252 |
| 4,839,402 | 6/1989 | Stevens | 523/200 |
| 4,862,713 | 9/1989 | Kutz et al. | 68/21 |
| 4,935,296 | 6/1990 | Stevens | 428/288 |
| 4,973,514 | 11/1990 | Gamble et al. | 428/297 |
| 4,983,456 | 1/1991 | Iwaskow et al. | 428/254 |
| 5,061,566 | 10/1991 | Morgan | 428/423.1 |
| 5,089,326 | 2/1992 | Bonazza | 428/284 |
| 5,210,116 | 5/1993 | Hashimoto et al. | 523/468 |
| 5,284,701 | 2/1994 | Hamon . | |
| 5,312,678 | 5/1994 | McCullough, Jr. et al. | 428/225 |
| 5,366,664 | 11/1994 | Varadan et al. . | |
| 5,721,019 | 2/1998 | Aschraft et al. | 427/425 |

OTHER PUBLICATIONS

*Engineered Materials Handbook: Ceramics and Glasses*, vol. 4, pp. 806–808 (ASM International, Dec. 1991).

Primary Examiner—Blaine R. Copenheaver
Attorney, Agent, or Firm—Burns, Doane, Swecker & Mathis, L.L.P.

[57] ABSTRACT

An EMI shielding member and method of making the member. The member includes a non-metallic substrate having an electrically non-conductive coating of a dielectric polymer matrix material loaded with an EMI shieldingly effective amount of electrically conductive fibers. The member can be formed by spraying the fiber loaded, dielectric polymer matrix onto a flexible fabric or tape.

10 Claims, 6 Drawing Sheets

ELECTROMAGNETIC ATTENUATING LAMINATE AND METHOD FOR ITS FORMATION

This application is a continuation of application Ser. No. 08/375,578, filed Jan. 19, 1995, now abandoned.

FIELD OF THE INVENTION

The invention relates to a method of applying an electromagnetic attenuating coating to a non-metallic substrate such as a woven or nonwoven fabric material or tape.

BACKGROUND OF THE INVENTION

Electromagnetic interference (EMI) shielding materials are disclosed in U.S. Pat. Nos. 4,935,296 and 5,089,326. The '296 patent discloses a composite containing an EMI shieldingly effective amount of metal-coated fibers, and details of such fibers can be found in U.S. Pat. Nos. 4,738,896; 4,759,950; 4,789,563 and 4,839,402. Radar absorptive coating materials are disclosed in U.S. Pat. Nos. 3,599,210 and 3,843,593. The '210 patent describes a coating containing fibers cut to a length of one-half wavelength of the anticipated radar frequency with the fibers being insulated along their lengths by thinly bonding a dielectric material such as epoxy, resin or varnish. The fibers are randomly dispersed within a solid matrix of resinous material.

U.S. Pat. No. 4,983,456 discloses electrically conductive laminates, conductive coatings, conductive adhesives, conductive inks, conductive gaskets and conductive caulking and sealing compounds wherein metal coated fibers are utilized. The fibers include a semi-metallic core made of carbon, boron or silicon-carbide and an electrically and/or thermally conductive layer of at least one electrodepositable metal.

U.S. Pat. No. 4,474,685 discloses high performance molding compounds for shielding electromagnetic interference. The patent describes electrically conductive bulk, granular or nodular molding compounds comprising a multicomponent filler system of particulate carbon black, graphite and metal particles.

U.S. Pat. No. 4,360,440 discloses a method of spraying a composite of adhesive and fiber onto a wall or ceiling. The adhesive exhibits increased fire-retardancy, flame resistance and thickness capability.

U.S. Pat. No. 4,534,998 discloses a coating process whereby an electrically conductive coating comprising carbon black, a wetting agent, and resin are sprayed onto a honeycomb structure in order to reduce the charging of a dielectric surface with potential gradients.

There is a need in the art for an EMI shielding material which provides flexibility of application. Further, it would be a significant advance in the art to provide a cost-effective method of applying an electromagnetic interference attenuating coating on a substrate to provide an EMI shielding member while imposing little impact on cost, weight or structural volume of a structure to which the shielding member is applied.

SUMMARY OF THE INVENTION

The invention provides an EMI shielding member which comprises a non-metallic substrate having an electrically non-conductive coating of a dielectric polymer matrix material loaded with an EMI shieldingly effective amount of electrically conductive fibers.

According to the various features of the invention, the non-metallic substrate can be a woven or nonwoven fabric or tape, which is flexible, and the matrix material can be a resin. The fibers can be randomly dispersed in the matrix material. The fibers can be solid metal, metal coated glass, tubular fused silica with one or more discrete conductive cores, silicon carbide or graphite. Further, the fibers can be rectilinear in shape and uniformly dispersed in the polymer matrix material. The fibers can have a diameter of 4 to 20 $\mu$m, and can comprise less than 1% by weight of the coating.

The invention further provides a method for making the EMI shielding member by coating a non-metallic substrate with an electrically non-conductive coating of a dielectric polymer matrix loaded with an EMI shieldingly effective amount of electrically conductive fibers. The coating can be applied to the non-metallic substrate by spraying and the substrate can be a flexible woven, or flexible nonwoven, fabric or tape.

BRIEF DESCRIPTION OF THE DRAWINGS

A more complete appreciation of the invention will be obtained by reference to the following detailed description, when considered in connection with the accompanying drawings, wherein.

DETAILED DESCRIPTION OF THE INVENTION

According to the invention, an EMI shielding member is provided wherein the member comprises a non-metallic substrate and an electrically non-conductive coating. The coating includes a dielectric polymer matrix loaded with an EMI shieldingly effective amount of electrically conductive fibers.

According to one embodiment of the invention, the fibers are long conductive fibers uniformly dispersed in an artificial dielectric coating, and the coating may be applied by spraying onto a woven cloth material or a tape in a controlled, repeatable manner to produce the desired electromagnetic attenuating property.

The electromagnetic properties of the coating may be adjusted to attenuate a specific range of frequencies by altering the lengths and diameters of the electrically conductive fibers, the coating thickness, and the amount of fibers loaded into the matrix.

Successful utilization of artificial dielectric coatings requires a uniform dispersion of fibers in a resin matrix. Adequate mixing of the conductive fibers in the resin can be achieved using an ordinary "RED DEVIL PAINT SHAKER" to provide the necessary oscillatory shaking action without the breakage of fibers normally associated with high shear mixing. The resin matrix may then be applied by spraying onto a woven cloth material or tape in such a manner as to provide the necessary random fiber placement and uniform coating thickness control. The resin matrix/fiber mixture has a suitable viscosity to provide a uniform spray coating.

Figure 1:
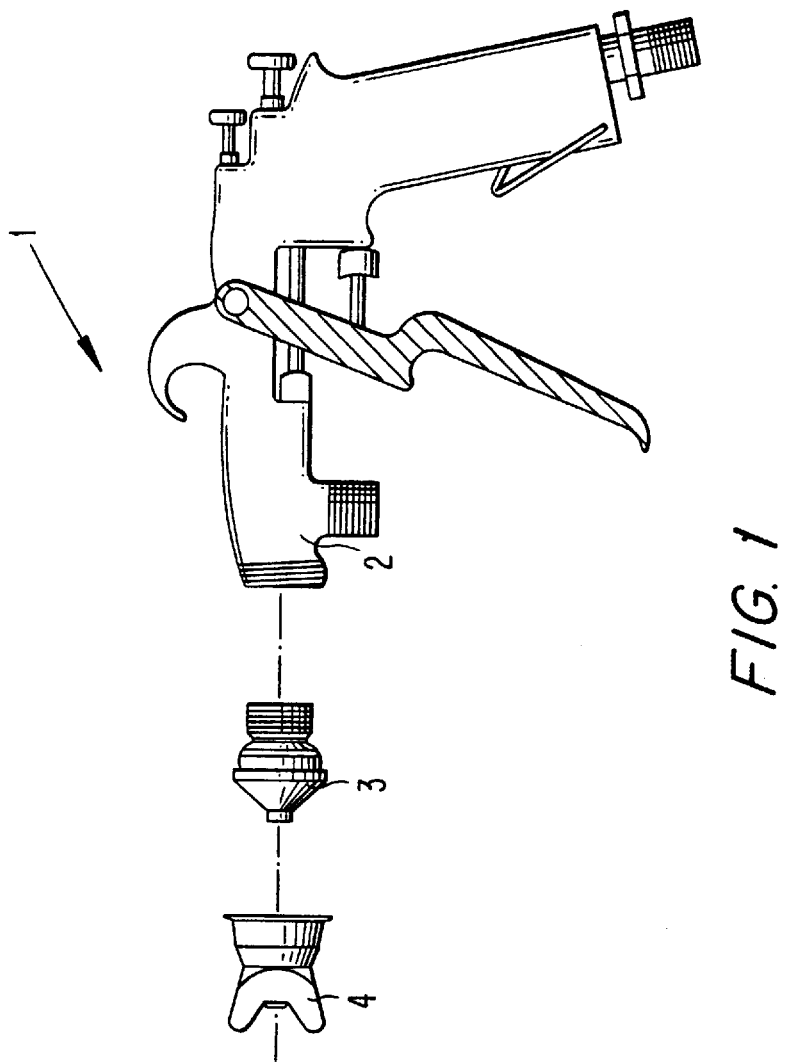
FIG. 1 shows an air nozzle spray gun of the type that can be used for spray application of a coating according to the claimed invention.

Spray application of the fiber containing matrix can be achieved with a smooth and unrestricted fluid transfer system which eliminates fiber damage. Such fluid transfer can be attained by using a modified bottom outlet pressure pot, large diameter (e.g. ½–¾ inch) fluid hoses and excessively large diameter rear seat fluid and air nozzle spray guns. A suitable air nozzle spray gun 1 is shown in FIG. 1. Air nozzle spray gun 1 comprises air spray gun body 2 with detachable tip 3, and horn type air cap 4. The tip 3 can have a ⅛ inch inner diameter outlet opening and the horn type air cap 4 can have a 3/16 inch inner diameter outlet opening. Adjustment of the atomizing and fluid air pressures will allow repeatable uniform spraying of the coating. Examples of suitable air nozzle spray guns include the Binks 18 D with 69×202 nozzle assembly and the Graco 204-000.

Figure 2:
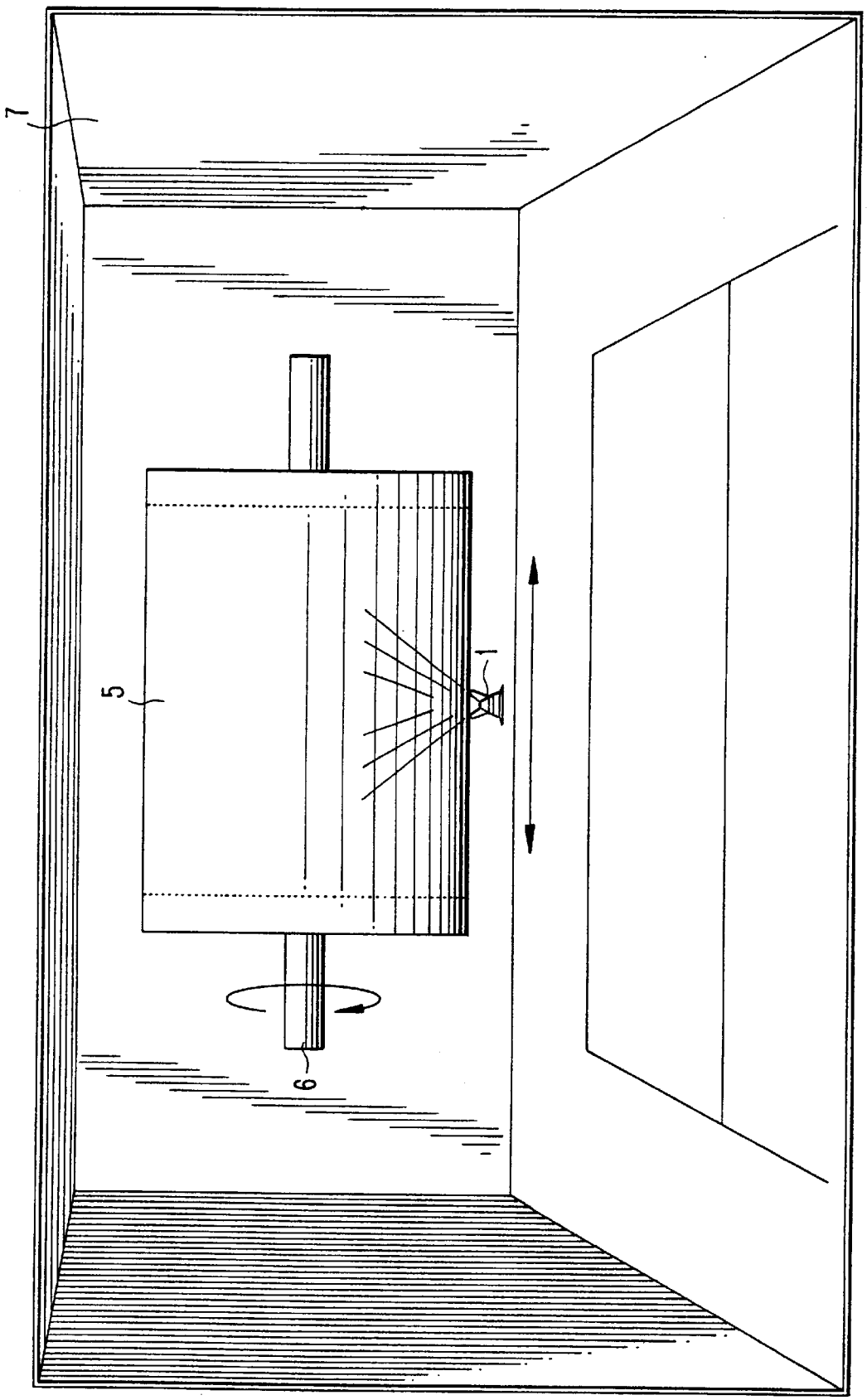
FIG. 2 shows a method of spray application of a coating onto a drum.

Uniform application of the fiber containing coating may be achieved by controlled spraying as in FIG. 2. Air nozzle spray gun 1 is positioned to direct a spray of fiber containing resin onto drum surface 5. During spray deposition, drum surface 5 is rotated about spindle 6 as air nozzle spray gun 1 is moved back and forth parallel to spindle 6 so as to deposit a uniform layer of the fiber-containing coating. The drum speed should be compatible with the drum diameter to allow a uniform deposit of the spray coating (e.g., approximately 60 rpm for a drum diameter of 4 feet). Spray booth 7 encloses the spraying apparatus.

Figure 3:
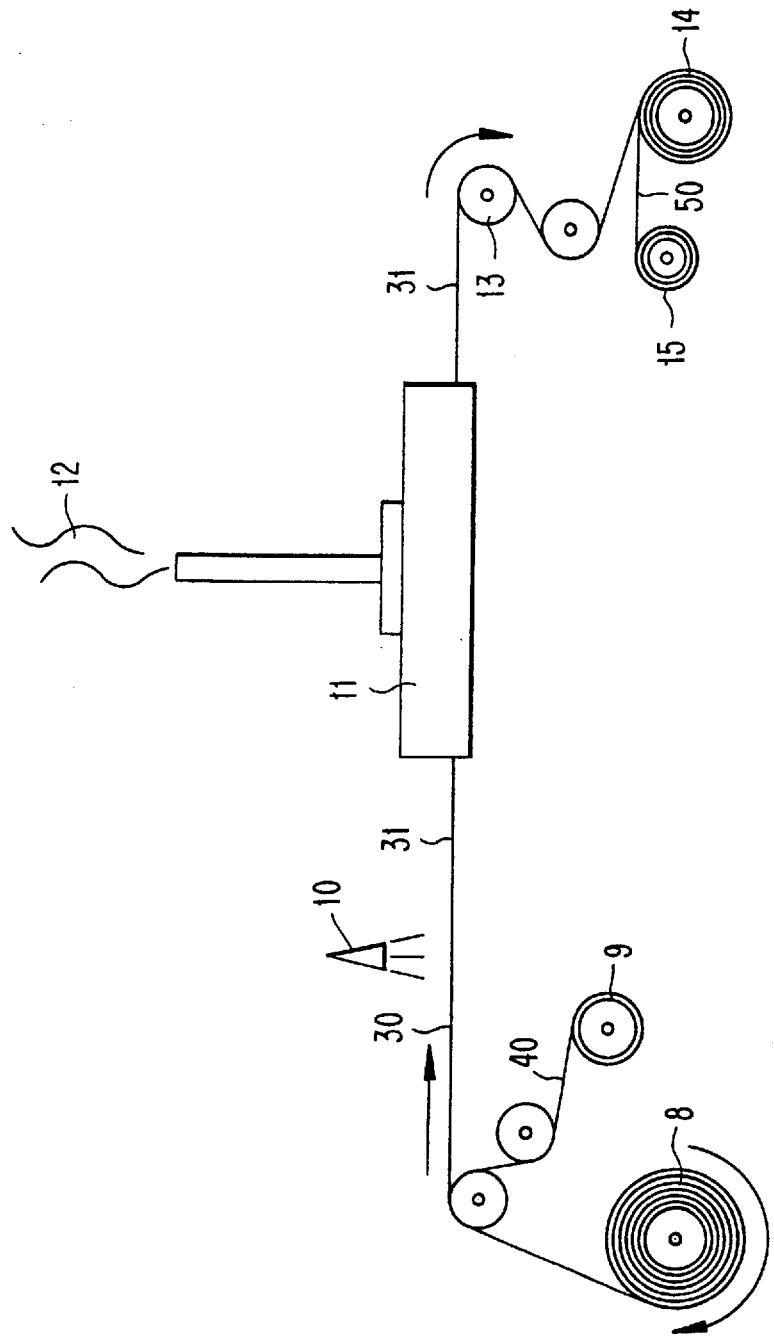
FIG. 3 shows a continuous process for spray application of a coating onto spooled substrate material.

An alternative single pass method for spray depositing resin matrix onto a moving strip of woven or nonwoven cloth material or tape such as fabric is illustrated in FIG. 3. Uncoated material 30 backed by polyliner material 40 is drawn from spool 8. The uncoated fabric material 30 can be a standard width, such as 38 inches wide, and can be formed from woven materials such as Nicalon, S-Glass and E-Glass. The polyliner backing material 40 is separated from the uncoated material and collected on take-up reel 9. The uncoated material 30 is then drawn past spray deposition system 10 where the material 30 is coated with a fiber-containing resin matrix. The speed at which the uncoated material 30 travels past the deposition system 10 can be adjusted to provide a suitable thickness of the sprayed coating (e.g., up to 0.005" coating thickness). The coated material 31 is then drawn through oven drying zone 11 where solvent vapors 12 are removed. The coated material 31 is then drawn over chill rolls (S-rolls) 13 and finally rewound on spool 14 with a protective polyliner backing material 50 from reel 15 inserted between adjacent layers of the coated material 31.

Figure 4:
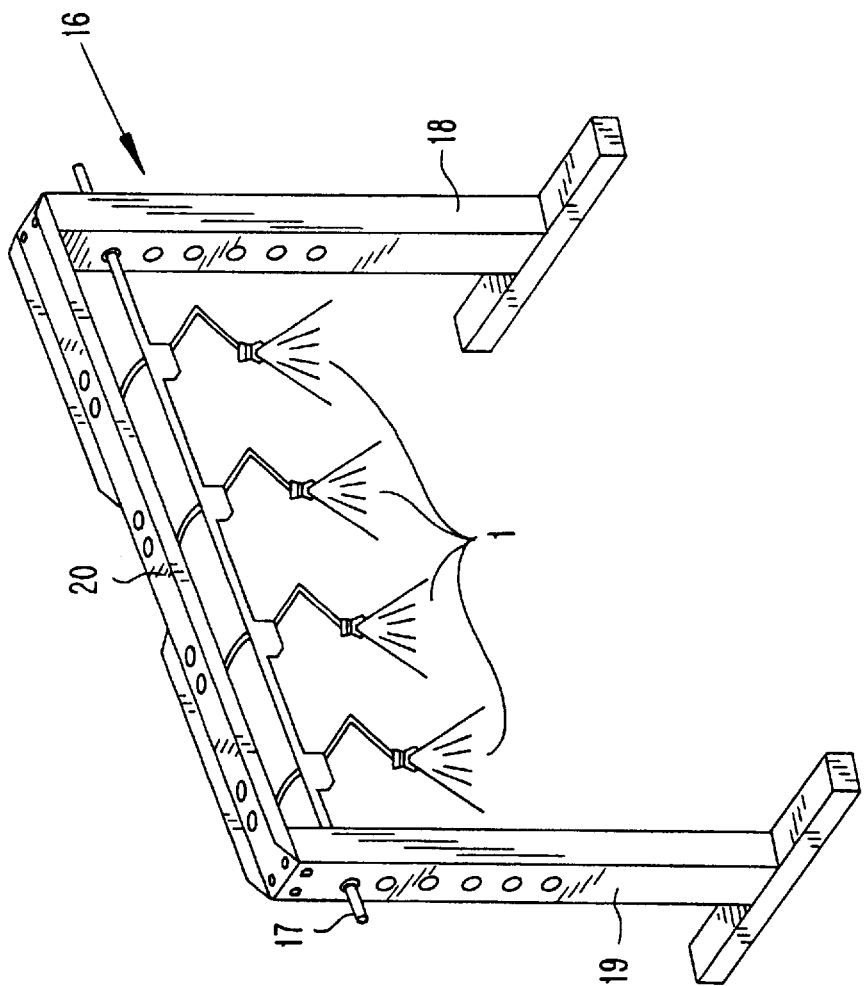
FIG. 4 shows a number of air nozzle spray guns positioned to consistently deliver a uniform coating onto relatively large areas of cloth material or tape.

An illustration of how a plurality of air nozzle spray guns 1 may be positioned and angled so as to consistently deliver a uniform coating of the electromagnetic attenuating coating onto larger areas of cloth material, tape or any other compatible substrate is shown in FIG. 4. Multiple sprayhead frame 16 comprises a plurality of air nozzle spray guns 1 suspended from a fiber-containing resin supply line 17. Supply line 17 is supported by vertical members 18 and 19, which are connected at their upper ends by horizontal member 20. Large area substrates can be uniformly coated with fiber-containing resin by passing the substrates underneath the spray nozzles. Adjustment of nozzle angles and positions may be used to achieve the desired thickness and uniformity of the sprayed coating. The cloth material and tape may be conveyed past the nozzles to be coated with the desired thickness of the fiber-containing resin.

The coating may be sprayed in a single layer or in multiple layers onto a variety of woven or nonwoven cloth materials or other thin sheets capable of supporting the resin matrix, such as ordinary fabric, prepreg materials, RTM materials, and filament winding materials. The fibers are typically randomly oriented in a two dimensional array lying in a plane parallel to the underlying substrate. Because of their flexibility, these materials may subsequently be laminated onto primary structures or nonstructural components for any application involving electromagnetic attenuation. A variety of suitable resins and cloth materials provides a large degree of flexibility in applying the electromagnetic attenuating coating. Electromagnetic interference attenuating materials of this type can be employed in a broad range of military and non-military applications such as circuit boards, electrically conductive surfaces, exterior surfaces such as airfoils or other surfaces of propelled devices, and various electrical appliances. For example, the coating could be used on ground, air and sea vehicles. The method of spraying onto a cloth material or other flexible supporting sheet allows freedom in designing electromagnetic attenuating surfaces. By choosing materials that are compatible with the article of application, virtually any surface may be treated.

The fiber-containing resin may also be sprayed onto a tape. The spray gun may be oriented and angled to apply the resin onto the tape as the tape is fed through a funnel which captures any excess resin. The tape may then be applied to any structure requiring electromagnetic attenuation by lamination or other means. An electromagnetic attenuating tape offers the advantage of easy application to a great variety of structures having complex geometries.

Manufacturing adaptability to various fabrication techniques makes the process particularly effective for automated manufacturing systems. The process may be used with a variety of compatible resins and cloth materials. Furthermore, because conventional structures may be retrofit with this process, existing structures can be provided with electromagnetic absorptive characteristics.

By choosing the desired fiber characteristics, the resin matrix can be composed to effectively attenuate electromagnetic interference while maintaining the structural integrity of the composite structure containing the resin. The fibers can be solid metal, metal coated glass, tubular fused silica with one or more discrete conductive cores, silicon carbide, or graphite. The concentration of conductive fibers can be any suitable amount such as less than 1 percent by weight of the coating. This process provides effective electromagnetic attenuation for a variety of fabrication techniques without significantly impacting on cost, weight or structural volume of the article.

Figure 5:
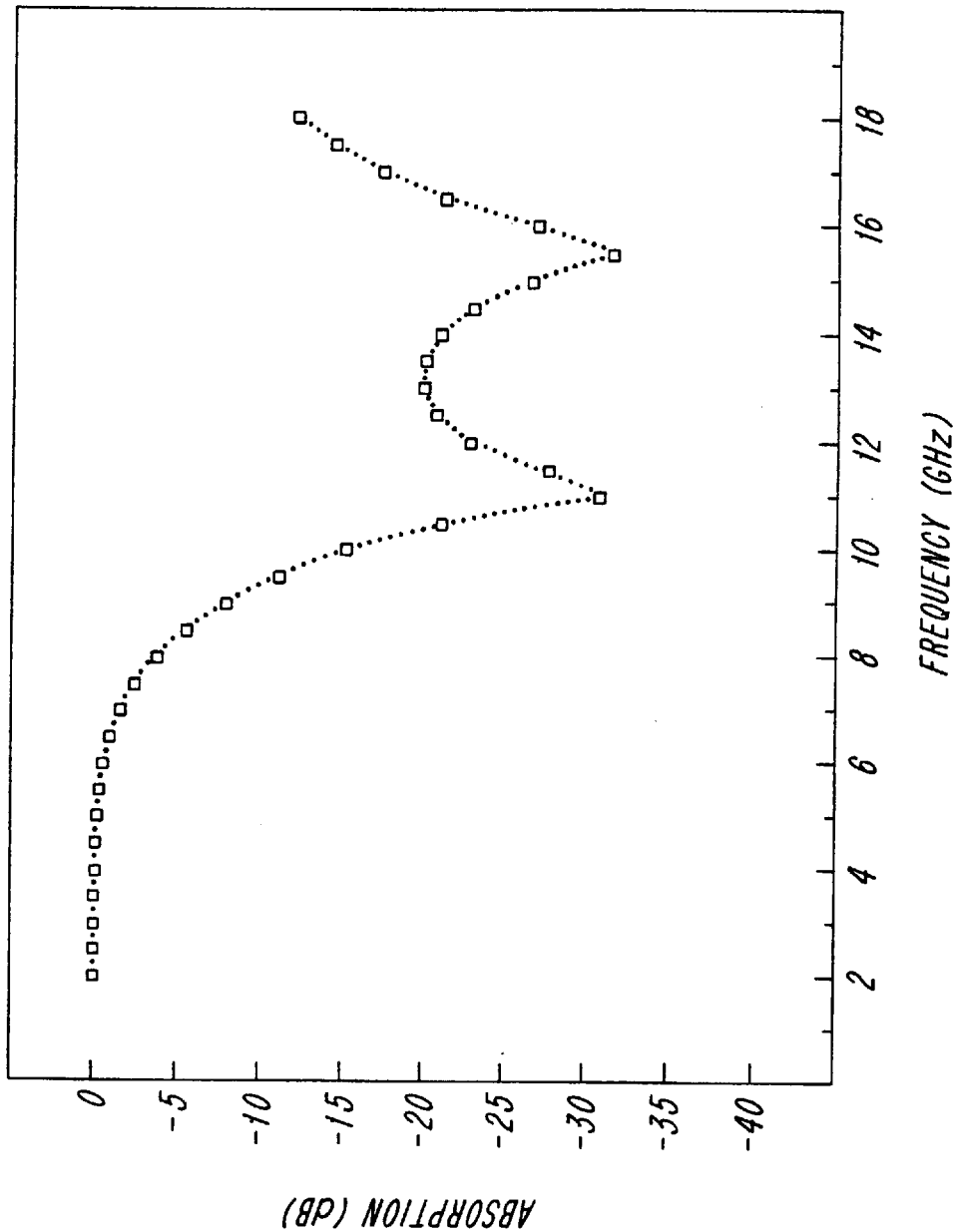
FIG. 5 shows the predicted EMI absorption characteristic of a coated laminate, composite panel.
Figure 6:
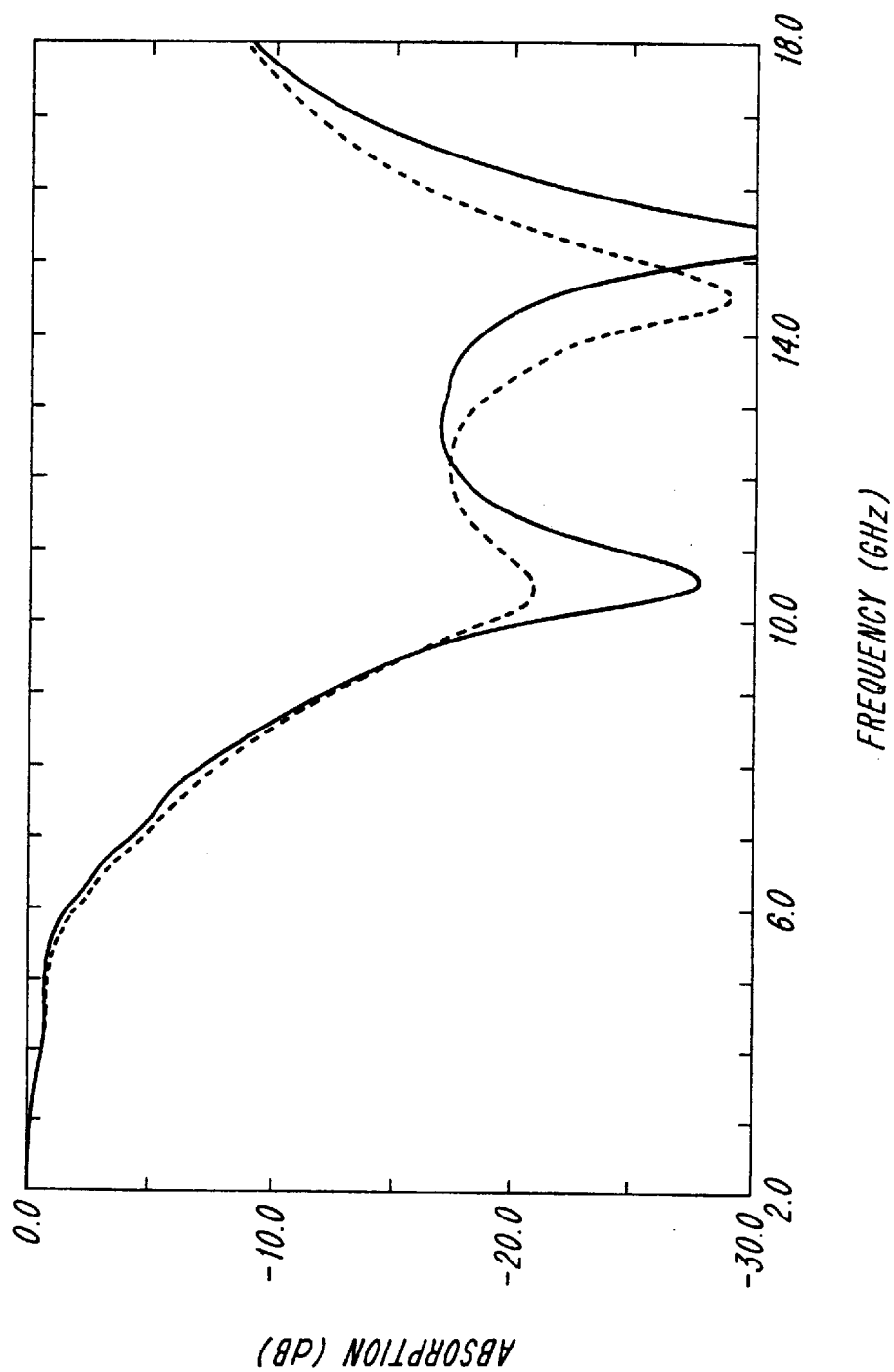
FIG. 6 illustrates the measured EMI absorption characteristic of a coated laminate, composite panel.

FIGS. 5 and 6 show EMI absorption characteristics that can be achieved by covering non-metallic panels with EMI shieldingly effective coatings according to the invention, wherein FIG. 5 shows predicted absorption and FIG. 6 shows measured absorption of a structure treated by the above process.

The foregoing has described the principles, preferred embodiments and modes of operation of the present invention. However, the invention should not be construed as being limited to the particular embodiments disclosed herein. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. An EMI shielding member comprising a non-metallic substrate having an electrically non-conductive coating of a dielectric polymer matrix material loaded with an EMI shieldingly effective amount of electrically conductive fibers, the fibers comprising less than 1% by weight of the coating.

2. The shielding member of claim 1, wherein the fibers are randomly dispersed in the matrix material.

3. The shielding member of claim 1, wherein the substrate comprises a flexible woven or nonwoven fabric or a flexible woven or nonwoven tape.

4. The shielding member of claim 1, wherein the fibers are selected from the group consisting of metal coated glass, tubular fused silica with one or more discrete conductive cores, silicon carbide and graphite fibers.

5. The shielding member of claim 1, wherein the fibers are rectilinear in shape and uniformly dispersed in the matrix material and randomly oriented.

6. The shielding member of claim 1, wherein the matrix material comprises a resin material.

7. The shielding member of claim 1, wherein the fibers have a diameter of 4 to 20 $\mu$m.

8. The shielding member of claim 1, wherein the fibers comprise solid metal fibers.

9. An EMI shielding member comprising:
a non-metallic substrate; and
an electrically non-conductive coating on said substrate, said coating comprising a dielectric polymer matrix loaded with an EMI shielding effective amount of electrically conductive material consisting essentially of electrically conductive fibers, the fibers being less than 1% by weight of the coating.

10. The shielding member of claim 9, wherein the electrically conductive material consists of electrically conductive fibers.

* * * * *